(12) United States Patent
Ueno et al.

(10) Patent No.: US 10,854,454 B2
(45) Date of Patent: Dec. 1, 2020

(54) SEMICONDUCTOR DEVICE AND METHOD FOR MANUFACTURING THE SAME

(71) Applicant: TOYODA GOSEI CO., LTD., Kiyosu (JP)

(72) Inventors: Yukihisa Ueno, Kiyosu (JP); Nariaki Tanaka, Kiyosu (JP); Junya Nishii, Kiyosu (JP); Toru Oka, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/390,151

(22) Filed: Apr. 22, 2019

(65) Prior Publication Data

US 2019/0341260 A1    Nov. 7, 2019

(30) Foreign Application Priority Data

May 7, 2018    (JP) .................................. 2018-089202

(51) Int. Cl.
*H01L 29/66*     (2006.01)
*H01L 21/265*    (2006.01)
(Continued)

(52) U.S. Cl.
CPC ........ *H01L 21/265* (2013.01); *H01L 29/4236* (2013.01); *H01L 29/66666* (2013.01); *H01L 29/7827* (2013.01)

(58) Field of Classification Search
CPC ............... H01L 29/4236; H01L 21/265; H01L 29/7827; H01L 29/2003; H01L 29/0638;
(Continued)

(56) References Cited

U.S. PATENT DOCUMENTS

2017/0133504 A1*  5/2017  Shiomi ............... H01L 29/0834
2017/0278952 A1   9/2017  Oka et al.
(Continued)

FOREIGN PATENT DOCUMENTS

JP    2017-174989 A    9/2017

*Primary Examiner* — Latanya N Crawford Eason
(74) *Attorney, Agent, or Firm* — McGinn I.P. Law Group, PLLC.

(57) ABSTRACT

To restrain a side portion of a trench from being damaged by ion implantation. A method for manufacturing a semiconductor device comprises a stacking process, an ion implantation process, a heat treatment process, a groove forming process, and a first electrode forming process. In the stacking process, a p-type semiconductor layer is stacked on a first n-type semiconductor layer. In the ion implantation process, an n-type impurity or a p-type impurity is ion-implanted into a position on a surface of the p-type semiconductor layer. The position is away from a position where a groove is to be formed. In the heat treatment process, heat treatment is performed to activate the ion-implanted impurity so as to form an implanted region and to diffuse a p-type impurity in the p-type semiconductor layer into the first n-type semiconductor layer located below the implanted region so as to form a p-type impurity diffused region. In the groove forming process, the groove that penetrates the p-type semiconductor layer and has a bottom portion located in the first n-type semiconductor layer is formed. In the first electrode forming process, the first electrode is formed on an insulation film on a surface of the groove.

2 Claims, 10 Drawing Sheets

(51) Int. Cl.
  *H01L 29/423* (2006.01)
  *H01L 29/78* (2006.01)

(58) Field of Classification Search
  CPC ............ H01L 29/0646; H01L 29/0623; H01L
          29/66666; H01L 29/0869; H01L 29/1095;
          H01L 29/41766; H01L 29/66734; H01L
                     29/7813; H01L 29/1033
  See application file for complete search history.

(56) References Cited

U.S. PATENT DOCUMENTS

2018/0138274 A1\* 5/2018 Ohse .................. H01L 29/0623
2019/0305079 A1\* 10/2019 Osuga ................ H01L 29/0696

\* cited by examiner

SEMICONDUCTOR DEVICE AND METHOD FOR MANUFACTURING THE SAME

CROSS-REFERENCE TO RELATED APPLICATIONS

The present application claims priority from Japanese patent application 2018-089202 filed on May 7, 2018, the entirety of the content of which is hereby incorporated by reference into this application.

BACKGROUND

Field

The present disclosure relates to a semiconductor device and a method for manufacturing the same.

Related Art

In a method for manufacturing a semiconductor device in the related art, an n-type impurity is ion-implanted into a position partly overlapping a position where a trench is formed, and heat treatment is performed to form a p-type impurity diffused region where a p-type impurity is diffused at a position overlapping a bottom surface of the trench (see, for example, JP2017-174989A). The p-type impurity diffused region relieves electric field concentration that occurs at the bottom surface of the trench when a voltage is applied.

However, in such a semiconductor device, damage by ion implantation may affect a side face of the trench where an inversion layer is formed when a voltage is applied, and may disadvantageously increase on-state resistance. In order to solve such circumstances, a technique for restraining the side face of the trench from being damaged by ion implantation, and relieving electric field concentration at the bottom surface of the trench has been called for.

SUMMARY

According to one aspect of the present disclosure, provided is a method for manufacturing a semiconductor device. This method comprises a stacking process, an ion implantation process, a heat treatment process, a groove forming process, and a first electrode forming process. In the stacking process, a p-type semiconductor layer is stacked on a first n-type semiconductor layer. In the ion implantation process, an n-type impurity or a p-type impurity is ion-implanted into a position on a surface of the p-type semiconductor layer. The position is away from a position where a groove is to be formed. In the heat treatment process, heat treatment is performed to activate the ion-implanted impurity so as to form an implanted region and to diffuse a p-type impurity in the p-type semiconductor layer into the first n-type semiconductor layer located below the implanted region so as to form a p-type impurity diffused region. In the groove forming process, the groove that penetrates the p-type semiconductor layer and has a bottom portion located in the first n-type semiconductor layer is formed. In the first electrode forming process, a first electrode is formed on an insulation film on a surface of the groove.

DETAILED DESCRIPTION

A. First Embodiment

Figure 1:
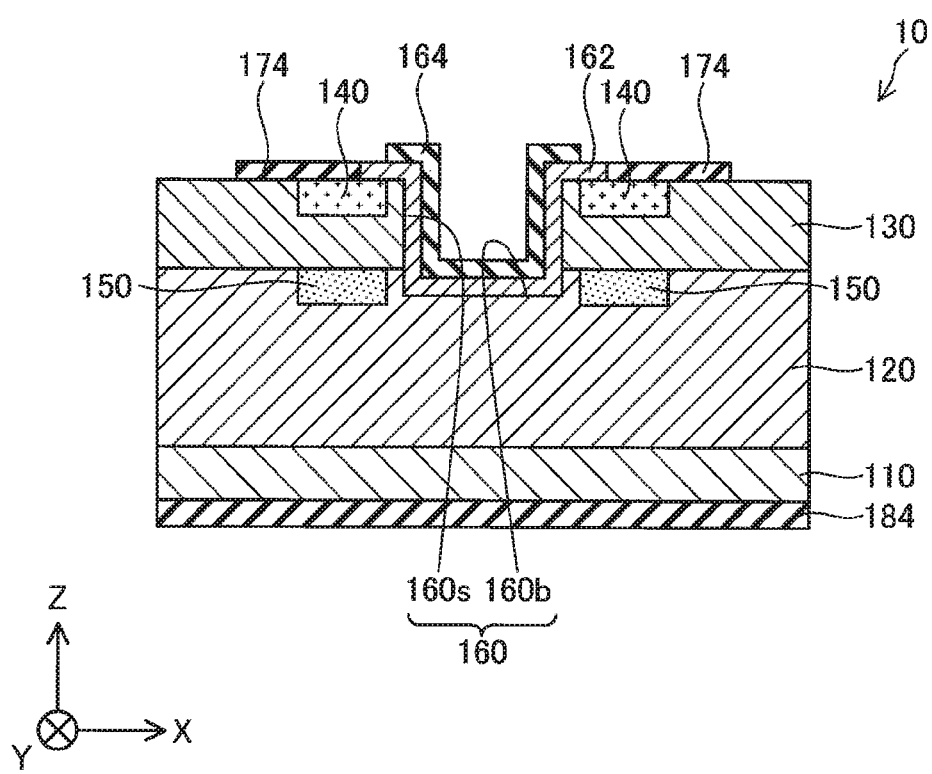
FIG. 1 is a schematic diagram illustrating part of a semiconductor device according to a first embodiment in cross section.

FIG. 1 is a schematic diagram illustrating part of a semiconductor device 10 according to a first embodiment in cross section. It should be noted that FIG. 1 and the following schematic diagrams are provided to clarify technical features of the semiconductor device 10 and are not intended for indicating dimensions of each component accurately. For ease of description, XYZ axes substantially orthogonal to one another are illustrated in FIG. 1. The XYZ axes in FIG. 1 correspond to XYZ axes in other drawings. In this description, for convenience, a +Z-axis direction side will be occasionally referred to as "upper side". This term "upper side" is not intended to limit arrangement (orientation) of the semiconductor device 10. In other words, the semiconductor device 10 may be arranged in any direction as suited.

The semiconductor device 10 includes a substrate 110, an n-type semiconductor layer 120, a p-type semiconductor layer 130, an n-type semiconductor region 140, a p-type impurity diffused region 150, a groove 160, an insulation film 162, a first electrode 164, a second electrode 174, and a third electrode 184.

The substrate 110, the n-type semiconductor layer 120, and the p-type semiconductor layer 130 are plate-shaped semiconductors extended along the X axis and the Y axis. According to the present embodiment, the substrate 110, the n-type semiconductor layer 120, and the p-type semiconductor layer 130 are gallium nitride (GaN)-based semiconductors. Examples of the gallium nitride-based semiconductors (GaN) may include not only gallium nitride (GaN) but also aluminum gallium nitride (AlGaN), indium gallium nitride (InGaN), and indium aluminum gallium nitride (In-AlGaN). It should be noted that in view of use for semiconductor devices for power control, gallium nitride (GaN) and aluminum gallium nitride (AlGaN) are preferable. According to the present embodiment, gallium nitride (GaN)

is used. It should be noted that insofar as the effects of the present embodiment may be obtained, part of gallium nitride (GaN) may be replaced with other Group III elements such as aluminum (Al) and indium (In), and that gallium nitride (GaN) may contain other impurities.

The substrate 110 is a semiconductor containing an n-type impurity. The substrate 110 is an n-type semiconductor having an n-type property. The substrate 110 contains silicon (Si) as the n-type impurity.

The n-type semiconductor layer 120 is a semiconductor containing an n-type impurity. The n-type semiconductor layer 120 is located on the +Z-axis direction side of the substrate 110. The n-type semiconductor layer 120 contains silicon (Si) as the n-type impurity. According to the present embodiment, the n-type semiconductor layer 120 corresponds to a subordinate concept of the first n-type semiconductor layer described in the summary section.

The p-type semiconductor layer 130 is a semiconductor containing a p-type impurity. The p-type semiconductor layer 130 is located on the +Z-axis direction side of the n-type semiconductor layer 120. The p-type semiconductor layer 130 contains magnesium (Mg) as the p-type impurity. A concentration of the p-type impurity in the p-type semiconductor layer 130 is higher than a concentration of the n-type impurity in the n-type semiconductor layer 120.

The n-type semiconductor region 140 is a semiconductor region in the p-type semiconductor layer 130, and is located on the +Z-axis direction side and extended along the X axis and the Y axis. The n-type semiconductor region 140 is formed in part of the p-type semiconductor layer 130 into which the n-type impurity is ion-implanted. The n-type semiconductor region 140 is at a position away in the X-axis direction from a position where the groove 160 described later is to be formed. According to the present embodiment, the n-type semiconductor region 140 is formed at a position 0.1 μm away in the X-axis direction from the position where the groove 160 is to be formed. It should be noted that this distance is not limited to 0.1 μm but may be suitably selected from a range from 0.05 μm to 2.0 μm. The n-type semiconductor region 140 contains silicon (Si) as the n-type impurity. According to the present embodiment, the n-type semiconductor region 140 has a concentration of silicon (Si) as the n-type impurity higher than a concentration of silicon (Si) in the n-type semiconductor layer 120.

The p-type impurity diffused region 150 is a semiconductor region in the n-type semiconductor layer 120, and is located on the +Z-axis direction side and extended along the X axis and the Y axis. The p-type impurity diffused region 150 is formed by the diffusion of the p-type impurity in the p-type semiconductor layer 130 The p-type impurity diffused region 150 is formed in part of the n-type semiconductor layer 120 where is at a position below the n-type semiconductor region 140. That is, these layers have impurity concentrations that decrease in the following order: the p-type impurity in the p-type semiconductor layer 130; the p-type impurity in the p-type impurity diffused region 150; and the n-type impurity in the n-type semiconductor layer 120. Here, "being at a position below the n-type semiconductor region 140" refers to being located on the n-type semiconductor layer 120 side (−Z-axis direction side) relative to the p-type semiconductor layer 130 side in a stacking direction (Z-axis direction) of the n-type semiconductor layer 120 and the p-type semiconductor layer 130, and also refers to at least partly overlapping the n-type semiconductor region 140 as viewed in the stacking direction (Z-axis direction). The p-type impurity diffused region 150 has a concentration of the p-type impurity higher than a concentration of the n-type impurity. The p-type impurity diffused region 150 is located in the −Z-axis direction from a level of a bottom portion 160b of the groove 160. It should be noted that the p-type impurity diffused region 150 may be located in the +Z-axis direction from the level of the bottom portion 160b of the groove 160 or flush with the bottom portion 160b of the groove 160 in the Z-axis direction.

The groove 160 penetrates the p-type semiconductor layer 130 and has the bottom portion 160b located in the n-type semiconductor layer 120. The n-type semiconductor layer 120 and the p-type semiconductor layer 130 are exposed to a side portion 160s of the groove 160. The insulation film 162 covers the groove 160 and part of a surface of the p-type semiconductor layer 130 close to the groove 160 in the X-axis direction. The first electrode 164 is a gate electrode formed on the insulation film 162 on a surface of the groove 160. When a voltage is applied to the first electrode 164, an inversion layer is formed in the p-type semiconductor layer 130 and serves as a channel to form a conductive path between the second electrode 174 and the third electrode 184 described below.

The second electrode 174 is an electrode in ohmic contact with the surface of the p-type semiconductor layer 130 that is opposite to a surface in contact with the n-type semiconductor layer 120. The second electrode 174 is formed on part of the surface of the p-type semiconductor layer 130 and at a position in contact with the n-type semiconductor region 140. The second electrode 174 is an electrode formed by stacking a layer made of aluminum (Al) on a layer made of titanium (Ti) and subjecting the stacked layers to heat treatment. The second electrode 174 is what is called a "source electrode". In addition to the source electrode, a body electrode in ohmic contact with the p-type semiconductor layer 130 may be formed.

The third electrode 184 is an electrode in ohmic contact with a −Z-axis direction side surface of the substrate 110. The third electrode 184 is an electrode formed by stacking a layer made of aluminum (Al) on a layer made of titanium (Ti) and subjecting the stacked layers to heat treatment. The third electrode 184 is what is called a "drain electrode".

According to the present embodiment, the first electrode 164 and the insulation film 162 are extended from the surface of the groove 160 to the part of the p-type semiconductor layer 130 into which the n-type impurity is ion-implanted. In other words, the first electrode 164 and the insulation film 162 are extended in the Z-axis direction from the surface of the groove 160 to the part of the p-type semiconductor layer 130 where the n-type semiconductor region 140 exists. Therefore, when a voltage is applied to the first electrode 164, the inversion layer may be formed to such a position as to be connected to the n-type semiconductor region 140. This ensures securing the conductive path. It should be noted that the insulation film 162 is formed on the p-type semiconductor layer 130 and extended longer in the X-axis direction than the first electrode 164.

Figure 2:
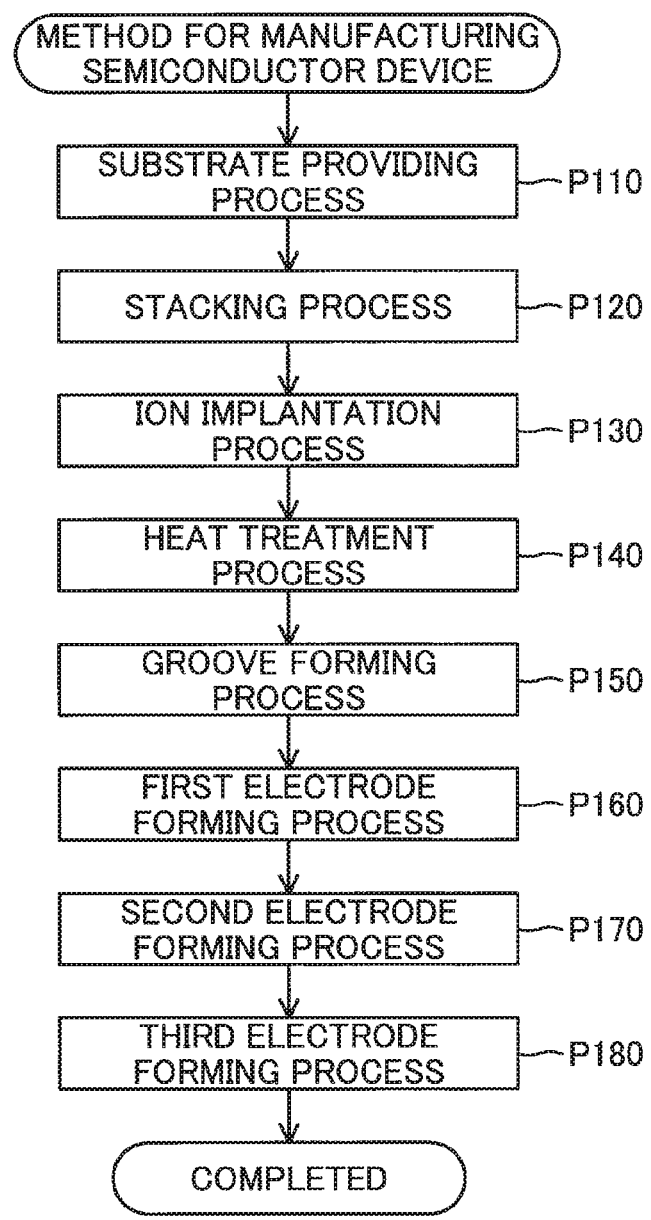
FIG. 2 is a process chart illustrating a method for manufacturing the semiconductor device according to the first embodiment.

FIG. 2 is a process chart illustrating a method for manufacturing the semiconductor device 10 according to the first embodiment. First, the manufacturer performs a substrate providing process of providing the substrate 110 (process P110). Next, the manufacturer performs a stacking process (process P120). In the stacking process (process P120), the n-type semiconductor layer 120 and the p-type semiconductor layer 130 are stacked on the substrate 110. The manufacturer employs metal organic chemical vapor deposition (MOCVD) to perform the stacking process.

Figure 3:
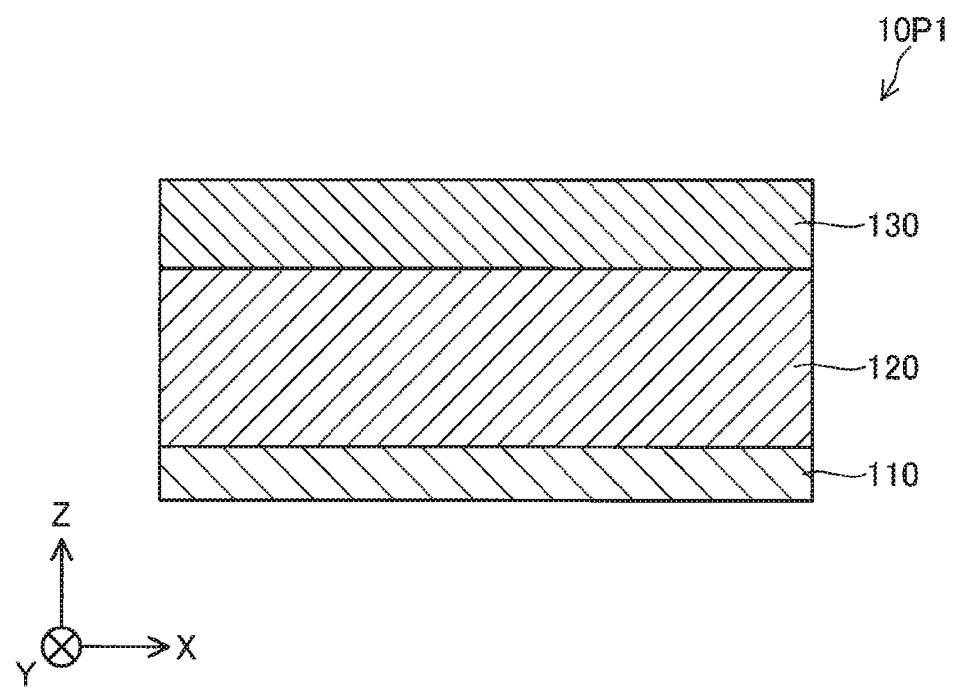
FIG. 3 is a sectional view schematically illustrating the structure of a semiconductor device after completion of process P120.

FIG. 3 is a sectional view schematically illustrating the structure of a semiconductor device 10P1 after completion of process P120. After undergoing process P120, the n-type semiconductor layer 120 and the p-type semiconductor layer 130 are formed on the substrate 110.

After the stacking process (FIG. 3, process P120), the manufacturer performs an ion implantation process (process P130). In the ion implantation process (process P130), the manufacturer ion-implants the n-type impurity into the p-type semiconductor layer 130 from an upper side. The n-type impurity ion-implanted is silicon (Si). In performing process P130, the manufacturer forms a film 210 and a mask 220 prior to ion implantation of the n-type impurity into the p-type semiconductor layer 130.

Figure 4:
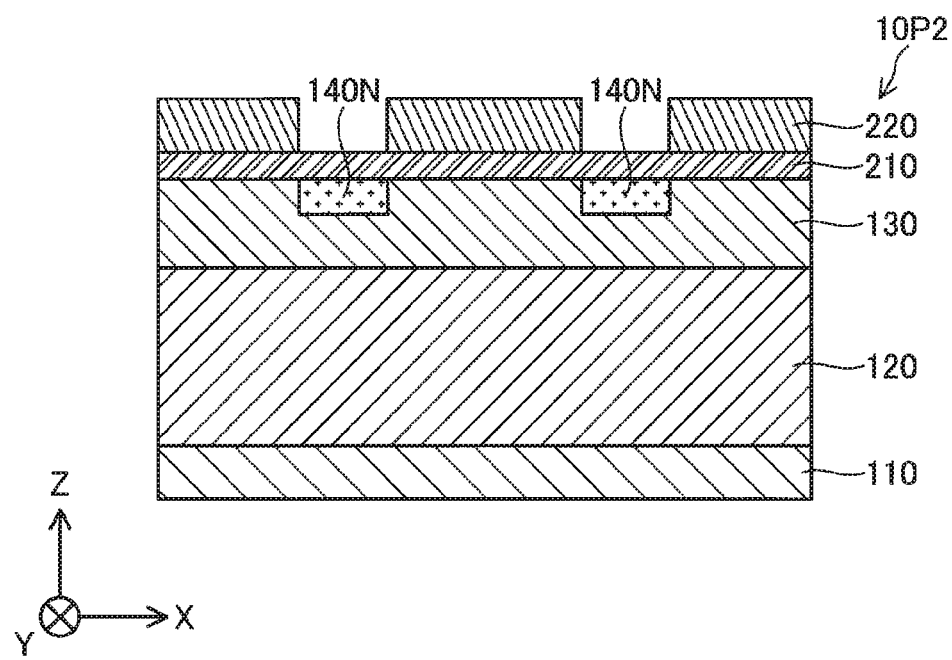
FIG. 4 is a sectional view schematically illustrating the structure of a semiconductor device after completion of process P130.

FIG. 4 is a sectional view schematically illustrating the structure of a semiconductor device 10P2 after completion of process P130. After undergoing process P130, the film 210 and the mask 220 are formed in sequence on the p-type semiconductor layer 130, and an ion-implanted region 140N is formed in part of the p-type semiconductor layer 130.

The film 210 is used to adjust a distribution of the impurity implanted by ion implantation in the depth direction of the p-type semiconductor layer 130. In other words, the film 210 is used to gather the n-type impurity implanted into the p-type semiconductor layer 130, to the vicinity of the surface of the p-type semiconductor layer 130. The film 210 also functions to prevent the surface of the p-type semiconductor layer 130 from being damaged by ion implantation. According to the present embodiment, the film 210 used is a film made of silicon dioxide ($SiO_2$). According to the present embodiment, the manufacturer forms the film 210 using plasma enhanced chemical vapor deposition (CVD).

The mask 220 is formed on an area of the p-type semiconductor layer 130 in which no n-type impurity is to be implanted. The position where the second electrode 174 is brought into ohmic contact with the n-type semiconductor region 140, and the position where the p-type impurity diffused region 150 is formed are considered to determine the shape of the mask 220. According to the present embodiment, the manufacturer forms the mask 220 using a photoresist.

With the film 210 and the mask 220 being formed on the p-type semiconductor layer 130, the manufacturer ion-implants the n-type impurity into the p-type semiconductor layer 130 from an upper side (process P130). As a result of the ion implantation (process P130), the n-type impurity is implanted into a region of the p-type semiconductor layer 130 under the remaining part of the film 210, which is not covered with the mask 220. This region thus formed is the ion-implanted region 140N. The concentration of the n-type impurity in the ion-implanted region 140N is adjustable to a desired concentration by regulating the material and the thickness of the film 210 and regulating the accelerating voltage and the dose amount of ion implantation. It should be noted that the n-type impurity implanted into the ion-implanted region 140N is not activated to serve as the n-type impurity, so that the ion-implanted region 140N does not have the n-type electrical conductivity. Accordingly, the ion-implanted region 140N is a region having a high resistance.

After the ion implantation process (FIG. 4, process P130), the manufacturer performs a heat treatment process (process P140). The heat treatment process (process P140) is performed to activate the n-type impurity in the ion-implanted region 140N. In performing process P140, the manufacturer removes the film 210 and the mask 220 and forms a cap film 230 prior to heat treatment. The film 210 and the mask 220 are removed by wet etching.

Figure 5:
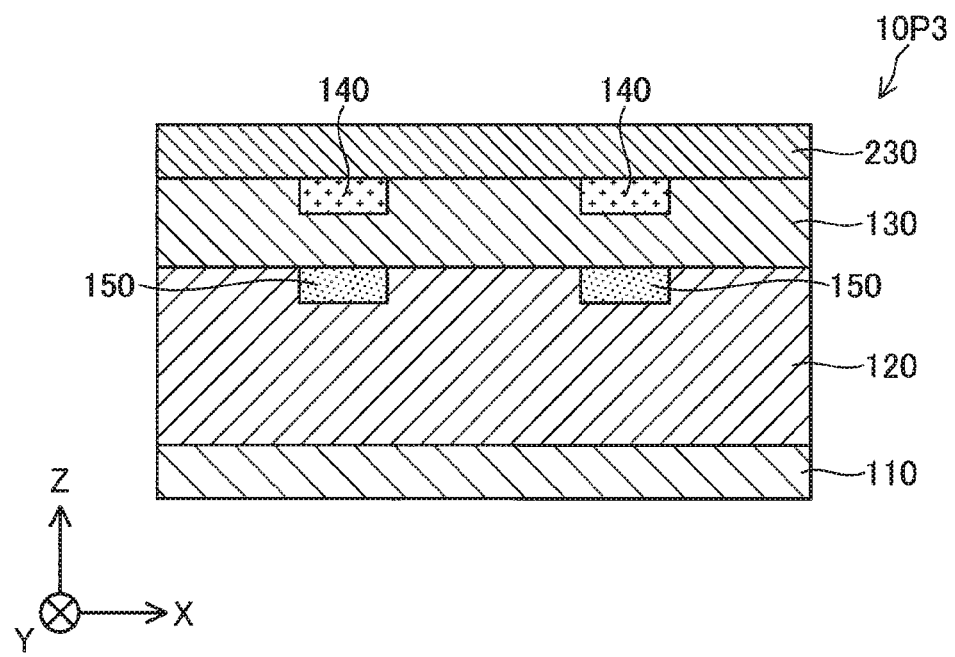
FIG. 5 is a sectional view schematically illustrating the structure of a semiconductor device after completion of process P140.

FIG. 5 is a sectional view schematically illustrating the structure of a semiconductor device 10P3 after completion of process P140. After undergoing process P140, the cap film 230 is formed on the p-type semiconductor layer 130. Moreover, after undergoing process P140, the n-type semiconductor region 140 is formed in part of the p-type semiconductor layer 130, and the p-type impurity diffused region 150 is formed in part of the n-type semiconductor layer 120.

The cap film 230 serves to prevent the surface of the p-type semiconductor layer 130 and the surface of the ion-implanted region 140N from being damaged by heating. According to the present embodiment, the manufacturer forms the cap film 230 by sputtering. According to the present embodiment, the cap film 230 is mainly made of silicon nitride ($SiN_x$).

With the cap film 230 being formed on the p-type semiconductor layer 130, the manufacturer heats the p-type semiconductor layer 130 and the ion-implanted region 140N (process P140). As a result of this heat treatment process (process P140), the ion-implanted region 140N becomes the n-type semiconductor region 140.

After undergoing the ion implantation process (process P130) and the heat treatment process (process P140), the p-type impurity diffused region 150 is formed. The p-type impurity diffused region 150 is formed by diffusion of the p-type impurity in the p-type semiconductor layer 130 into the n-type semiconductor layer 120. The concentration of the p-type impurity in the p-type impurity diffused region 150 is adjustable by regulating the accelerating voltage and the dose amount at the time of ion implantation (process P130) and regulating the heating temperature and the heating time in the heat treatment (process P140). For example, the accelerating voltage or the dose amount is increased at the time of ion implantation (process P130) so as to increase the concentration of the p-type impurity diffused in the p-type impurity diffused region 150.

After the heat treatment process (FIG. 5, process P140), the manufacturer performs a groove forming process (process P150) of forming the groove 160. The cap film 230 is removed by wet etching after the heat treatment process (process P140) and prior to the groove forming process (process P150). After the groove forming process (process P150), the manufacturer performs a first electrode forming process (process P160) of forming the first electrode 164. In the first electrode forming process (process P160), the first electrode 164 is formed on the insulation film 162 on the surface of the groove 160.

Figure 6:
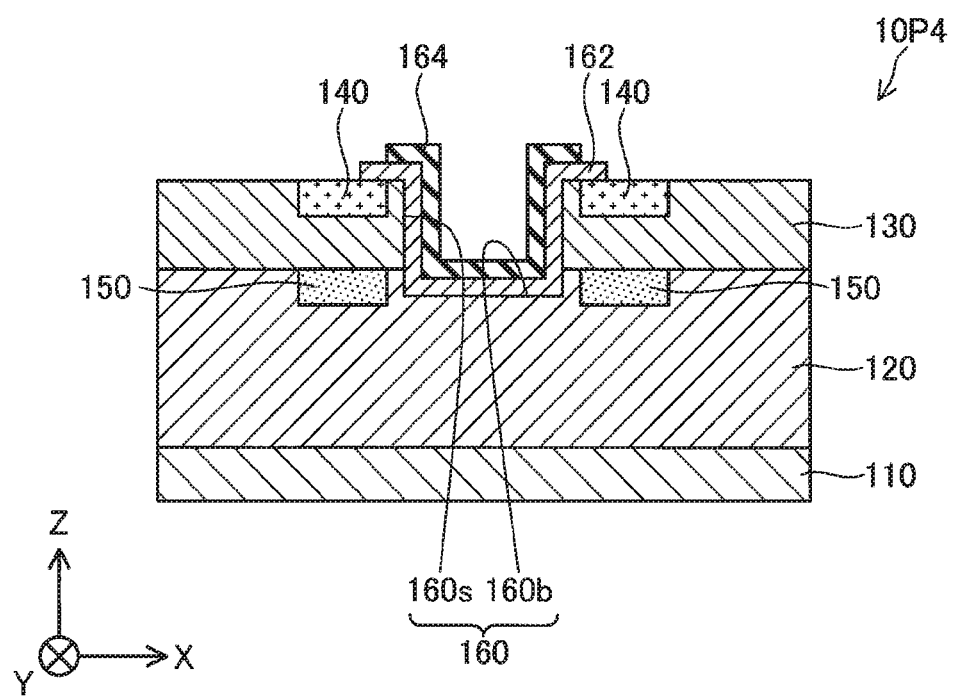
FIG. 6 is a sectional view schematically illustrating the structure of a semiconductor device after completion of process P160.

FIG. 6 is a sectional view schematically illustrating the structure of a semiconductor device 10P4 after completion of process P160. After undergoing process P160, the groove 160, the insulation film 162, and the first electrode 164 are formed in the semiconductor device 10P4.

After the first electrode forming process (FIG. 6, process P160), the manufacturer performs a second electrode forming process (process P170) of forming the second electrode 174 and a third electrode forming process (process P180) of forming the third electrode 184 in sequence. The semiconductor device 10 illustrated in FIG. 1 is completed through process P110 to process P170.

According to the first embodiment described above, the position into which the n-type impurity is ion-implanted is away in the X-axis direction from the position where the groove 160 is to be formed, so as to restrain the side portion 160s of the groove 160 from being damaged by the ion implantation. Moreover, the ion implantation of the n-type impurity and the heat treatment cause the p-type impurity in the p-type semiconductor layer 130 to be diffused to form the p-type impurity diffused region 150, accordingly electric field concentration that occurs at the bottom portion 160b of the groove 160 is relieved. Furthermore, the p-type impurity diffused region 150 to relieve electric field concentration and the n-type semiconductor region 140 to secure the conductive path from the second electrode 174 to the inversion layer may be both formed in the ion implantation process (process P130) and the heat treatment process (process P140) to reduce the number of processes in the manufacturing process.

B. Second Embodiment

Figure 7:
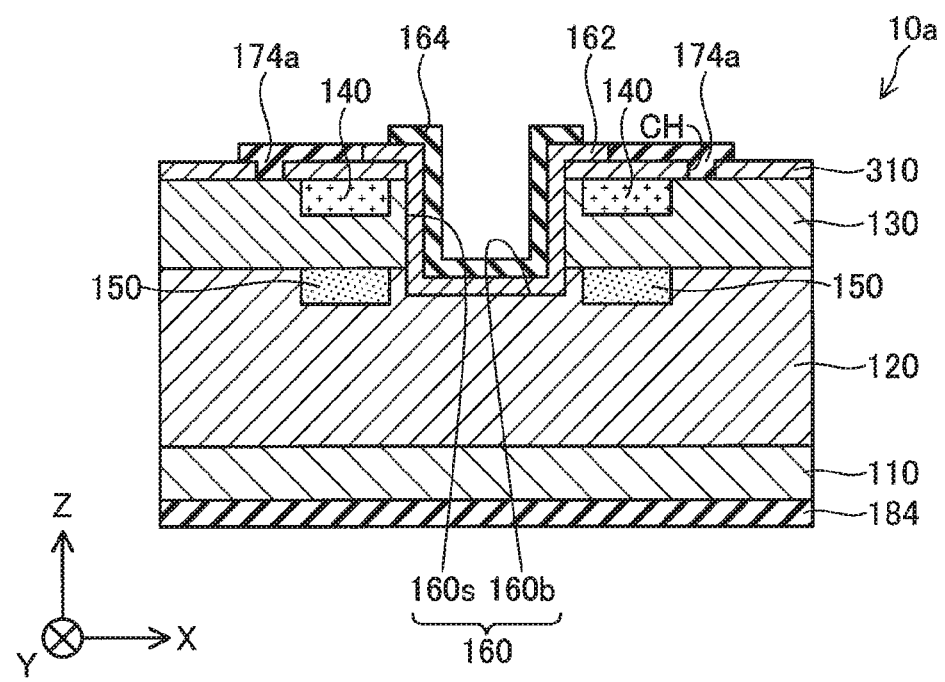
FIG. 7 is a schematic diagram illustrating part of a semiconductor device according to a second embodiment in cross section.

FIG. 7 is a schematic diagram illustrating part of a semiconductor device 10a according to a second embodiment in cross section. The semiconductor device 10a has substantially the same structure as the semiconductor device 10 according to the first embodiment except for including a second electrode 174a different from the second electrode 174 according to the first embodiment, and an n-type semiconductor layer 310. The same reference numerals as those of the first embodiment are used to represent the same components as those of the first embodiment that the preceding description refers to.

The n-type semiconductor layer 310 is a semiconductor containing an n-type impurity. The n-type semiconductor layer 310 is located on the +Z-axis direction side of the p-type semiconductor layer 130. The n-type semiconductor layer 310 contains silicon (Si) as the n-type impurity. The n-type semiconductor layer 310 is formed on the surface of the p-type semiconductor layer 130 from the position where the groove 160 is to be formed at least to the n-type semiconductor region 140. More specifically, the n-type semiconductor layer 310 is extended from the position where the groove 160 is to be formed at least to a position on the p-type semiconductor layer 130 at which the n-type semiconductor region 140 exists in the Z-axis direction. According to the present embodiment, the n-type semiconductor layer 310 is formed over the entire surface of the p-type semiconductor layer 130 on the +Z-axis direction side.

The second electrode 174a is an electrode in ohmic contact with the n-type semiconductor layer 310. In a similar manner to the second electrode 174 according to the first embodiment, the second electrode 174a is what is called a "source electrode". Through a contact hole CH that penetrates the n-type semiconductor layer 310 to the p-type semiconductor layer 130, the second electrode 174a is formed in contact with the p-type semiconductor layer 130 as well, and also functions as a body electrode.

Figure 8:
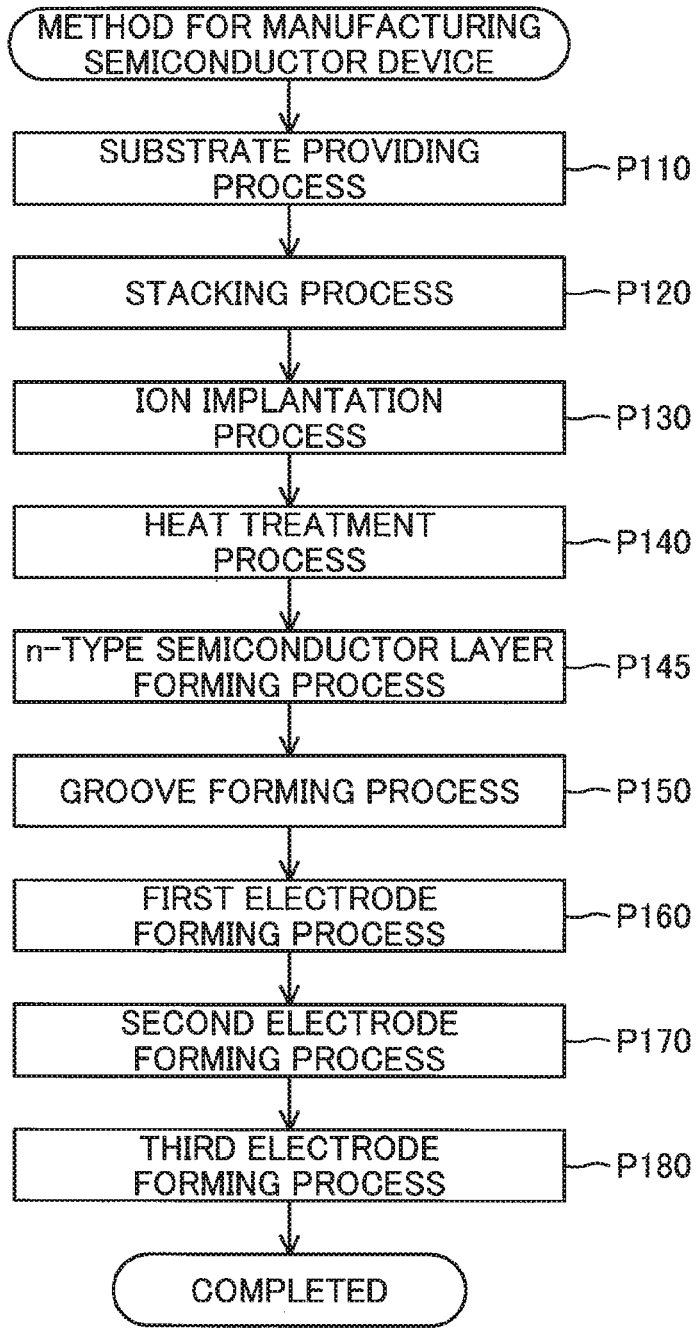
FIG. 8 is a process chart illustrating a method for manufacturing the semiconductor device according to the second embodiment.

FIG. 8 is a process chart illustrating a method for manufacturing the semiconductor device 10a according to the second embodiment. The method for manufacturing the semiconductor device 10a is obtained by adding process P145 between process P140 and process P150 in the method for manufacturing the semiconductor device 10 illustrated in FIG. 2. In FIG. 8, substantially the same processes as in the method for manufacturing the semiconductor device 10 illustrated in FIG. 2 will not be elaborated here.

After the heat treatment process (FIG. 8, process P140), the manufacturer performs an n-type semiconductor layer forming process (process P145) of forming the n-type semiconductor layer 310. In forming the n-type semiconductor layer 310, the contact hole CH is also formed. After that, the manufacturer performs the groove forming process (process P150) and the following processes. The groove 160 penetrates the n-type semiconductor layer 310 and the p-type semiconductor layer 130 and is formed to have the bottom portion 160b located in the n-type semiconductor layer 120. It should be noted that the heat treatment process (process P140) and the n-type semiconductor layer forming process (process P145) may be performed in a reverse order.

According to the second embodiment described above, substantially the same effects as the semiconductor device 10 according to the first embodiment are obtained. Moreover, it is possible to reduce an increase in channel length caused by forming the n-type semiconductor region 140 at the position away from the position where the groove 160 is to be formed. The increase in channel length in this description refers to the channel length being increased by a distance in the X-axis direction from the n-type semiconductor region 140 to the side portion 160s of the groove 160. The reason is that in comparison with the structure in which the n-type semiconductor region is formed in contact with the position where the groove is to be formed, the n-type semiconductor region 140 is formed at the position away in the X-axis direction from the position where the groove 160 is to be formed according to the second embodiment. However, according to the second embodiment, such an increase in channel length may be reduced because the n-type semiconductor layer 310 is extended from the position where the groove 160 is to be formed at least to the position on the p-type semiconductor layer 130 at which the n-type semiconductor region 140 exists in the Z-axis direction. In the case where the ion-implanted region is damaged by ion implantation, contact with the electrode is so difficult to obtain that contact resistance and on-state resistance tend to increase. However, the second electrode 174a is in contact with the n-type semiconductor layer 310 to decrease the on-state resistance.

C. Third Embodiment

Figure 9:
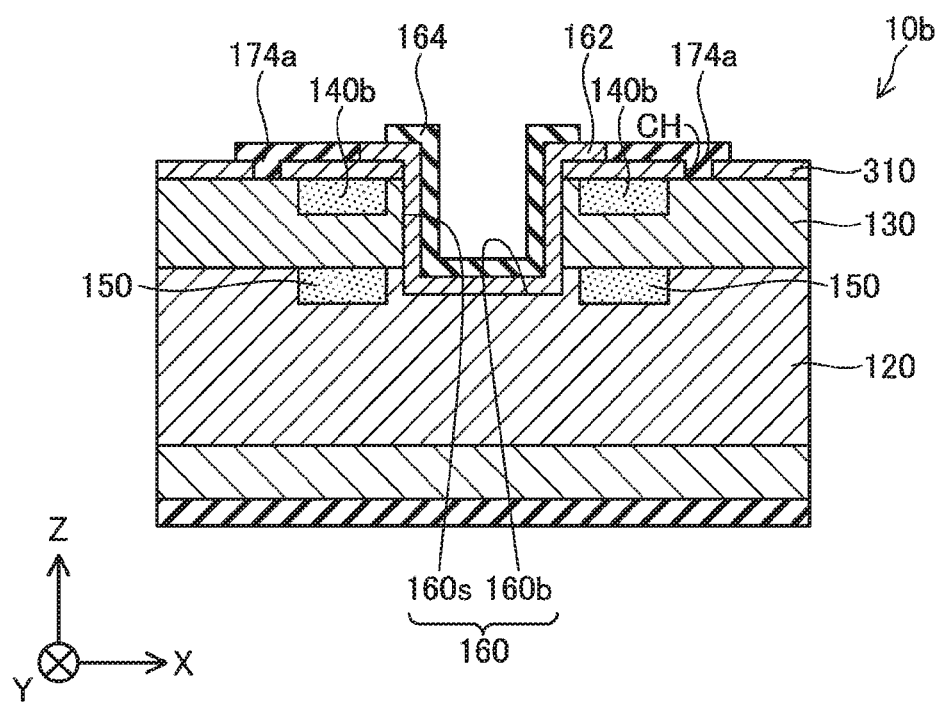
FIG. 9 is a schematic diagram illustrating part of a semiconductor device according to a third embodiment in cross section.

FIG. 9 is a schematic diagram illustrating part of a semiconductor device 10b according to a third embodiment in cross section. The semiconductor device 10b has substantially the same structure as the semiconductor device 10a according to the second embodiment except for including a p-type semiconductor region 140b instead of the n-type semiconductor region 140. The same reference numerals as those of the first embodiment are used to represent the same components as those of the first embodiment that the preceding description refers to.

The p-type semiconductor region 140b is a semiconductor region in the p-type semiconductor layer 130, and is located on the +Z-axis direction side and extended along the X axis and the Y axis. The p-type semiconductor region 140b is formed in part of the p-type semiconductor layer 130 into which a p-type impurity is ion-implanted. The p-type semiconductor region 140b is at a position away in the X-axis direction from the position where the groove 160 is to be formed. The p-type semiconductor region 140b contains magnesium (Mg) as the p-type impurity. According to the present embodiment, the p-type semiconductor region 140b has a concentration of magnesium (Mg) as the p-type impurity higher than a concentration of magnesium (Mg) of the rest of the p-type semiconductor layer 130 where the p-type semiconductor region 140b is not formed. As described in the first embodiment, the p-type impurity diffused region 150 is formed by diffusion of the p-type impurity in the p-type semiconductor layer 130 into the n-type semiconductor layer 120. According to the third embodiment with this structure, the n-type semiconductor layer 310 may be used as a source.

D. Fourth Embodiment

Figure 10:
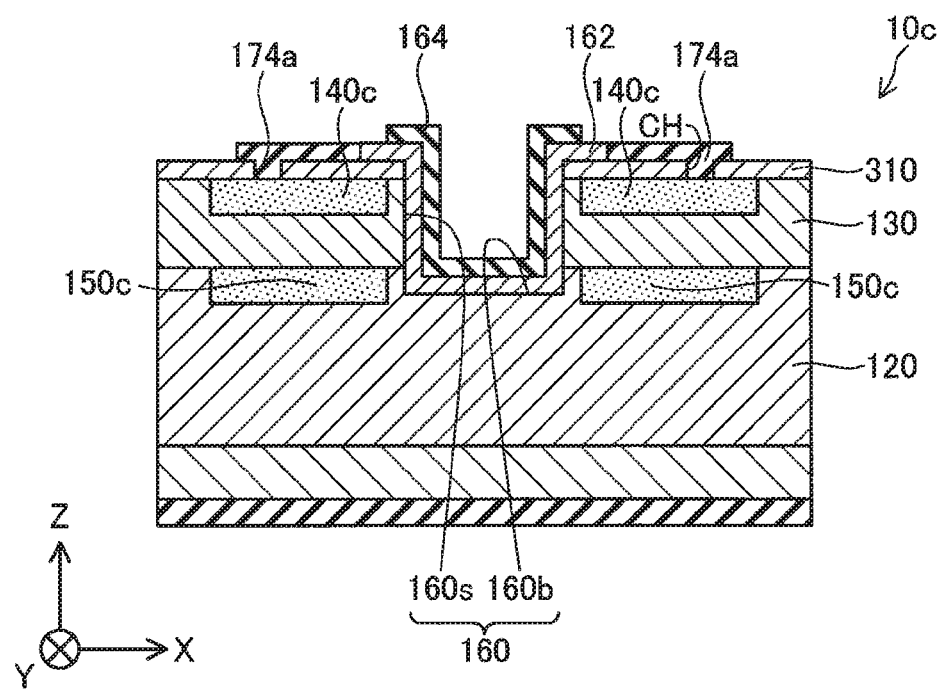
FIG. 10 is a schematic diagram illustrating part of a semiconductor device according to a fourth embodiment in cross section.

FIG. 10 is a schematic diagram illustrating part of a semiconductor device 10c according to a fourth embodiment in cross section. The semiconductor device 10c has substantially the same structure as the semiconductor device 10b according to the third embodiment except for including a p-type semiconductor region 140c and a p-type impurity diffused region 150c instead of the p-type semiconductor region 140b and the p-type impurity diffused region 150 according to the third embodiment. The same reference numerals as those of the third embodiment are used to represent the same components as those of the third embodiment that the preceding description refers to.

In a similar manner to the p-type semiconductor region 140b, the p-type semiconductor region 140c is formed in part of the p-type semiconductor layer 130 into which a p-type impurity is ion-implanted. The p-type semiconductor region 140c is at a position away in the X-axis direction from the position where the groove 160 is to be formed. The p-type semiconductor region 140c is formed to include a position on the p-type semiconductor layer 130 at which the second electrode 174a is in contact with the p-type semiconductor layer 130 through the contact hole CH. In other words, the p-type semiconductor region 140c is extended longer in the X-axis direction than the p-type semiconductor region 140b. The p-type impurity diffused region 150c is formed by diffusion of the p-type impurity in the p-type semiconductor layer 130 into the n-type semiconductor layer 120. In comparison with the p-type semiconductor region 140b according to the second embodiment, the p-type semiconductor region 140c is extended longer in the X-axis direction. Consequently, the p-type impurity diffused region 150c is extended longer in the X-axis direction than the p-type impurity diffused region 150 according to the second embodiment.

E. Modifications

In the first embodiment, the groove forming process (process P150) is performed after the ion implantation process (process P130) and the heat treatment process (process P140). However, the present disclosure is not limited to this. For example, the ion implantation process (process P130) and the heat treatment process (process P140) may be performed after the groove forming process (process P150).

The disclosure is not limited to any of the embodiment and its modifications described above but may be implemented by a diversity of configurations without departing from the scope of the disclosure. For example, the technical features of any of the embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

(1) According to one aspect of the present disclosure, provided is a method for manufacturing a semiconductor device. This method comprises a stacking process, an ion implantation process, a heat treatment process, a groove forming process, and a first electrode forming process. In the stacking process, a p-type semiconductor layer is stacked on a first n-type semiconductor layer. In the ion implantation process, an n-type impurity or a p-type impurity is ion-implanted into a position on a surface of the p-type semiconductor layer. The position is away from a position where a groove is to be formed. In the heat treatment process, heat treatment is performed to activate the ion-implanted impurity so as to form an implanted region and to diffuse a p-type impurity in the p-type semiconductor layer into the first n-type semiconductor layer located below the implanted region so as to form a p-type impurity diffused region. In the groove forming process, the groove that penetrates the p-type semiconductor layer and has a bottom portion located in the first n-type semiconductor layer is formed. In the first electrode forming process, a first electrode is formed on an insulation film on a surface of the groove. This structure restrains a side portion of a trench from being damaged by the ion implantation, because the position where the impurity is ion-implanted is away from the position where the groove is to be formed. Moreover, as a result of the ion implantation of the impurity and the heat treatment, the p-type impurity in the p-type semiconductor layer is diffused to form the p-type impurity diffused region, accordingly electric field concentration that occurs at the bottom portion of the trench is relieved.

(2) In the method for manufacturing the semiconductor device according to the above aspect, the impurity may be the n-type impurity. The method may further comprise a second electrode forming process of forming a second electrode to be conductive to the implanted region. In the first electrode forming process, the first electrode may be formed on the insulation film in a range from the surface of the groove at least to the implanted region of the surface of the p-type semiconductor layer. The first electrode is not electrically connected to the second electrode. This structure ensures that an inversion layer is formed as far as a position to be connected to the implanted region when a voltage is applied to the first electrode, because the first electrode is formed on the insulation film in the range as far as the position on the p-type semiconductor layer into which the n-type impurity is ion-implanted. Accordingly the conductive path is secured.

(3) The method for manufacturing the semiconductor device according to the above aspect may further comprise a second n-type semiconductor layer forming process of forming a second n-type semiconductor layer on the surface of the p-type semiconductor layer after the ion implantation process, and a second electrode forming process of forming a second electrode to be conductive to the second n-type semiconductor layer. The second n-type semiconductor layer may be in a range from the position where the groove is to be formed at least to the implanted region. The first electrode is not electrically connected to the second electrode. In the case where the impurity ion-implanted is the n-type impurity, this structure reduces an increase in channel length caused by ion-implanting the n-type impurity into the position away from the position where the groove is to be formed. Because an implanted region damaged by ion implantation is unlikely to obtain contact with an electrode, contact resistance and on-state resistance tend to increase. However, the second electrode is in contact with the second n-type semiconductor layer to decrease the on-state resistance. In the case where the impurity ion-implanted is the p-type impurity, the second n-type semiconductor layer is used as a source.

(4) According to another aspect of the present disclosure, a semiconductor device is provided. This semiconductor device comprises a stacked body, a groove, an impurity implanted region, a p-type semiconductor region, and a first electrode. The stacked body includes a first n-type semiconductor layer and a p-type semiconductor layer stacked on the first n-type semiconductor layer. The groove penetrates the p-type semiconductor layer and has a bottom portion located in the first n-type semiconductor layer. The impurity implanted region is formed from a surface of the p-type semiconductor layer to inside of the p-type semiconductor layer. The impurity implanted region is at a position away from a position where the groove is to be formed. The impurity implanted region has an impurity concentration different from an impurity concentration of the p-type semiconductor layer. The p-type semiconductor region is formed in the first n-type semiconductor layer located below the impurity implanted region. The first electrode is formed on an insulation film on a surface of the groove.

(5) In the semiconductor device according to the above aspect, the impurity implanted region may be a region into which an n-type impurity is implanted. The semiconductor device may further comprise a second electrode to be conductive to the impurity implanted region. The first electrode may be formed on the insulation film in a range from the surface of the groove at least to a position on the surface of the p-type semiconductor layer at which the impurity implanted region is formed.

(6) The semiconductor device according to the above aspect may further comprise a second n-type semiconductor layer on the surface of the p-type semiconductor layer, and a second electrode to be conductive to the second n-type semiconductor layer. The second n-type semiconductor layer may be in a range from the position where the groove is to be formed at least to the impurity implanted region.

The present disclosure may be implemented in various modes other than the method for manufacturing the semiconductor device. For example, the present disclosure is implementable in such a mode as a semiconductor device manufactured by the above-described manufacturing method, and an apparatus of manufacturing a semiconductor device utilizing the manufacturing method.

According to the present disclosure, the position where the impurity is ion-implanted is away from the position where the groove is to be formed so as to restrain the side portion of the trench from being damaged by the ion implantation. Moreover, as a result of the ion implantation of the impurity and the heat treatment, the p-type impurity in the p-type semiconductor layer is diffused to form the p-type impurity diffused region, accordingly electric field concentration that occurs at the bottom portion of the trench is relieved.

What is claimed is:
1. A semiconductor device comprising:
 a stacked body including a first n-type semiconductor layer and a p-type semiconductor layer stacked on the first n-type semiconductor layer;
 a groove that penetrates the p-type semiconductor layer and has a bottom portion located in the first n-type semiconductor layer;
 an impurity implanted region formed from a surface of the p-type semiconductor layer to inside of the p-type semiconductor layer, the impurity implanted region being at a position away from a position where the groove is to be formed, the impurity implanted region having an impurity concentration different from an impurity concentration of the p-type semiconductor layer;
 a p-type semiconductor region formed in the first n-type semiconductor layer located below the impurity implanted region; and
 a first electrode formed on an insulation film on a surface of the groove,
 wherein there is no impurity implanted region existing beneath the groove and contacting the groove,
 wherein the impurity implanted region is a region into which an n-type impurity is implanted,
 the semiconductor device further comprising a second electrode to be conductive to the impurity implanted region,
 wherein the first electrode is formed on the insulation film in a range from the surface of the groove at least to a position on the surface of the p-type semiconductor layer at which the impurity implanted region is formed.
2. The semiconductor device according to claim 1, further comprising:
 a second n-type semiconductor layer formed on the surface of the p-type semiconductor layer in a range from the position where the groove is to be formed at least to the impurity implanted region; and
 a second electrode to be conductive to the second n-type semiconductor layer.

* * * * *